(12) United States Patent
Ishihara

(10) Patent No.: US 11,915,955 B1
(45) Date of Patent: Feb. 27, 2024

(54) WORKPIECE INSPECTION APPARATUS

(71) Applicant: TAKAOKA TOKO CO., LTD., Tokyo (JP)

(72) Inventor: Mitsuhiro Ishihara, Aichi (JP)

(73) Assignee: TAKAOKA TOKO CO., LTD., Tokyo (JP)

( * ) Notice: Subject to any disclaimer, the term of this patent is extended or adjusted under 35 U.S.C. 154(b) by 0 days.

(21) Appl. No.: 18/213,639

(22) Filed: Jun. 23, 2023

Related U.S. Application Data

(63) Continuation of application No. PCT/JP2022/039412, filed on Oct. 21, 2022.

(51) Int. Cl.
| | |
|---|---|
| *H01L 21/677* | (2006.01) |
| *G01N 21/95* | (2006.01) |
| *H01L 21/66* | (2006.01) |
| *H01L 21/67* | (2006.01) |
| *G01N 35/10* | (2006.01) |

(52) U.S. Cl.
CPC ... *H01L 21/67703* (2013.01); *G01N 21/9501* (2013.01); *H01L 21/67288* (2013.01); *H01L 22/12* (2013.01); *G01N 35/10* (2013.01)

(58) Field of Classification Search
CPC .............. H01L 22/12; H01L 21/67288; H01L 21/67703; G01N 21/9501; G01N 21/9503; G01N 21/9505
USPC ............................ 257/21.53, 21.531, 21.529
See application file for complete search history.

(56) References Cited

U.S. PATENT DOCUMENTS

| | | | |
|---|---|---|---|
| 9,494,529 B1* | 11/2016 | Fresquet | ............ G01N 21/8806 |
| 2013/0058741 A1 | 3/2013 | Fujimori et al. | |
| 2013/0201488 A1 | 8/2013 | Ishihara | |
| 2013/0344629 A1* | 12/2013 | Baek | ...................... B28D 5/029 |
| | | | 294/185 |
| 2015/0204660 A1 | 7/2015 | Ishihara | |
| 2016/0365267 A1 | 12/2016 | Kakutani et al. | |

FOREIGN PATENT DOCUMENTS

| | | |
|---|---|---|
| JP | 2002-357635 A | 12/2002 |
| JP | 2003-114251 A | 4/2003 |
| JP | 2006-090918 A | 4/2006 |
| JP | 2009-038146 A | 2/2009 |
| JP | 2009-295814 A | 12/2009 |

(Continued)

OTHER PUBLICATIONS

Machine Translation of KR-101446170-B1 (Year: 2014).*

(Continued)

*Primary Examiner* — Nathaniel J Kolb
(74) *Attorney, Agent, or Firm* — Nakanishi IP Associates, LLC

(57) ABSTRACT

A workpiece inspection apparatus includes: a first stage configured to transfer a first table, on which a workpiece accommodated in a tray is loaded at a first transfer position, to an inspection position; an inspection tool configured to inspect workpieces at the inspection position; a second stage configured to transfer a second table, on which another workpiece is loaded at a second transfer position, to the inspection position after retraction of the first table; and a transporter configured to load the workpieces before inspection to the first and second transfer positions and unload the workpieces after inspection from the first and second transfer positions.

5 Claims, 7 Drawing Sheets

(56) References Cited

FOREIGN PATENT DOCUMENTS

| | | | | |
|---|---|---|---|---|
| JP | 2013-057572 A | 3/2013 | | |
| JP | 2013-160612 A | 8/2013 | | |
| JP | 2015-135285 A | 7/2015 | | |
| JP | 2015-162590 A | 9/2015 | | |
| JP | 2016-054256 A | 4/2016 | | |
| KR | 101446170 B1 * | 10/2014 | ....... | H01L 21/67721 |

OTHER PUBLICATIONS

Notification of Reasons for Refusal issued in Japanese Patent Application No. 2023-504339 dated Mar. 7, 2023 with English Translation (6 pages).

Decision to Grant Patent issued in Japanese Patent Application No. 2023-504339 dated Apr. 4, 2023 with English Translation (5 pages).

\* cited by examiner

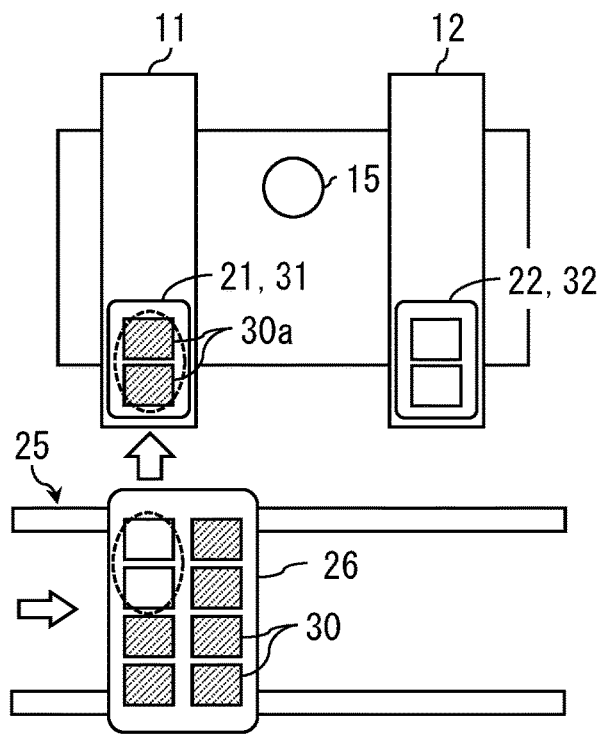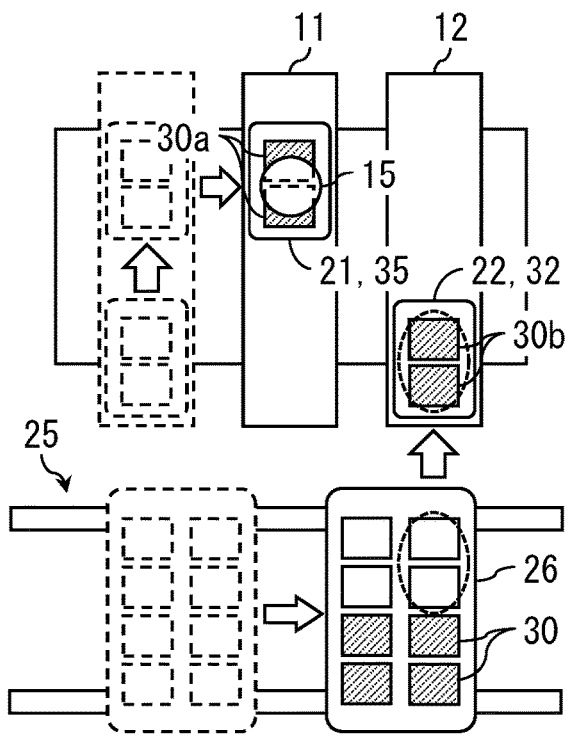
FIG. 2A　　　　　　　FIG. 2B
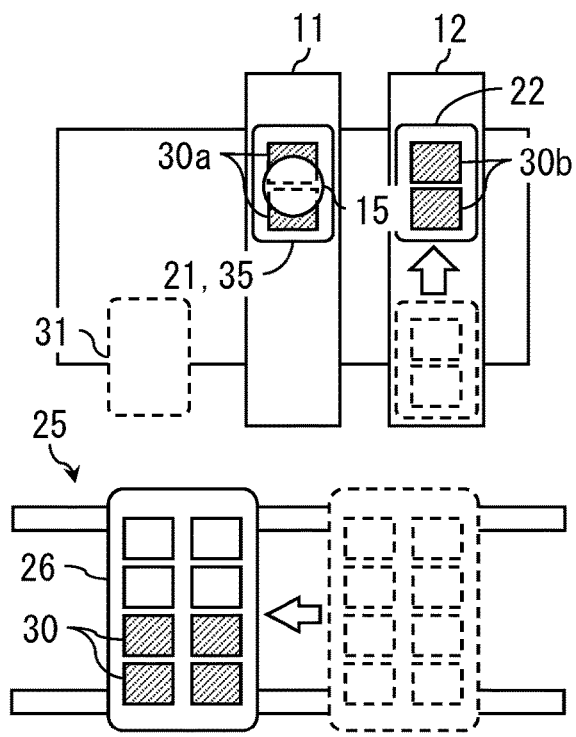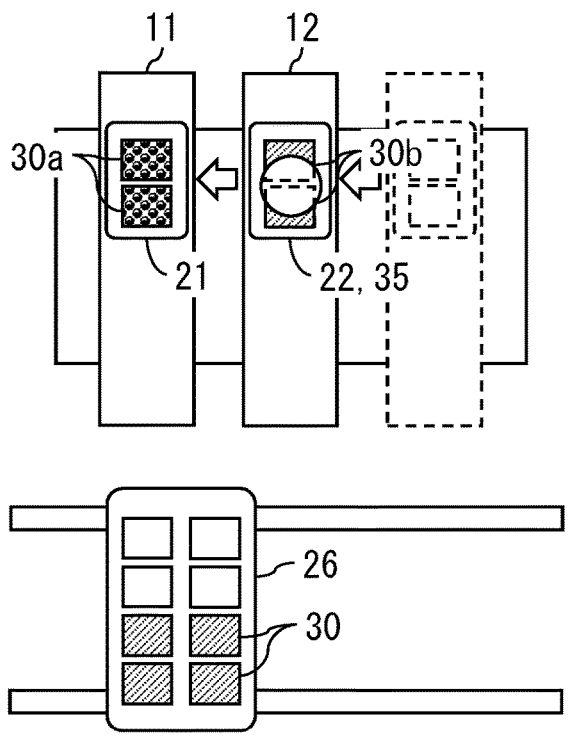
FIG. 2C　　　　　　　FIG. 2D

WORKPIECE INSPECTION APPARATUS

CROSS-REFERENCE TO RELATED APPLICATIONS

This application is a Continuation Application of No. PCT/JP2022/039412, filed on Oct. 21, 2022, the entire contents of which are incorporated herein by reference.

TECHNICAL FIELD

The present invention relates to a workpiece inspection technique for picking up and inspecting a workpiece accommodated in a tray.

BACKGROUND

Inspection of semiconductor packages, chips after being cut into multiple pieces and separated from the wafer, and the like can be roughly divided into the following two types. The first one is an in-tray method in which a workpiece as an inspection target is inspected in the state of being accommodated in a tray configured to accommodate the workpiece (for example, Patent Document 1). The second one is a pick-and-place method in which the workpiece is unloaded from the tray so as to be placed on an inspection table and be inspected and then is loaded on the tray again after the inspection (for example, Patent Document 2).

PRIOR ART DOCUMENT

Patent Document

[Patent Document 1] JP 2009-295814 A
[Patent Document 1] JP 2003-114251 A

SUMMARY

Problems to be Solved by Invention

When the inspection tool is small-size and lightweight and can be placed on an XY stage and be moved, there is no problem with the in-tray method. However, when the optical system is large-size like an optical three-dimensional measurement instrument configured to inspect bumps, it is difficult to place the inspection tool on the XY stage and move it, which makes it difficult to implement the in-tray method. Also when it is necessary to suck and hold the workpiece during inspection, the in-tray method is not appropriate.

Although the pick-and-place method can overcome the above-described disadvantages of the in-tray method, the pick-and-place method requires replacement work in which workpieces to be inspected are unloaded from and loaded onto the tray. Thus, this replacement work takes a lot of time, and there is a problem that throughput decreases.

In view of the above-described circumstances, an object of the present invention is to provide a technique for inspecting workpieces without decreasing throughput even in the case of applying a large-size inspection tool.

Solution to Problem

A workpiece inspection apparatus according to the present invention includes: a first stage configured to transfer a first table, on which a workpiece is loaded at a first transfer position, to an inspection position; an inspection tool configured to inspect the workpiece at the inspection position; a second stage configured to transfer a second table, on which another workpiece is loaded at a second transfer position, to the inspection position after retraction of the first table; and a transporter configured to load the workpiece before inspection to each of the first transfer position and the second transfer position and unload the workpiece after inspection from each of the first transfer position and the second transfer position.

Effect of Invention

According to the present invention, a technique for inspecting workpieces without decreasing throughput even in the case of applying a large-size inspection tool is provided.

BRIEF DESCRIPTION OF DRAWINGS

FIGS. 2A, 2B, 2C, and 2D are schematic diagrams illustrating the operation of the workpiece inspection apparatus according to the first embodiment.

DETAILED DESCRIPTION

First Embodiment

Figure 1:
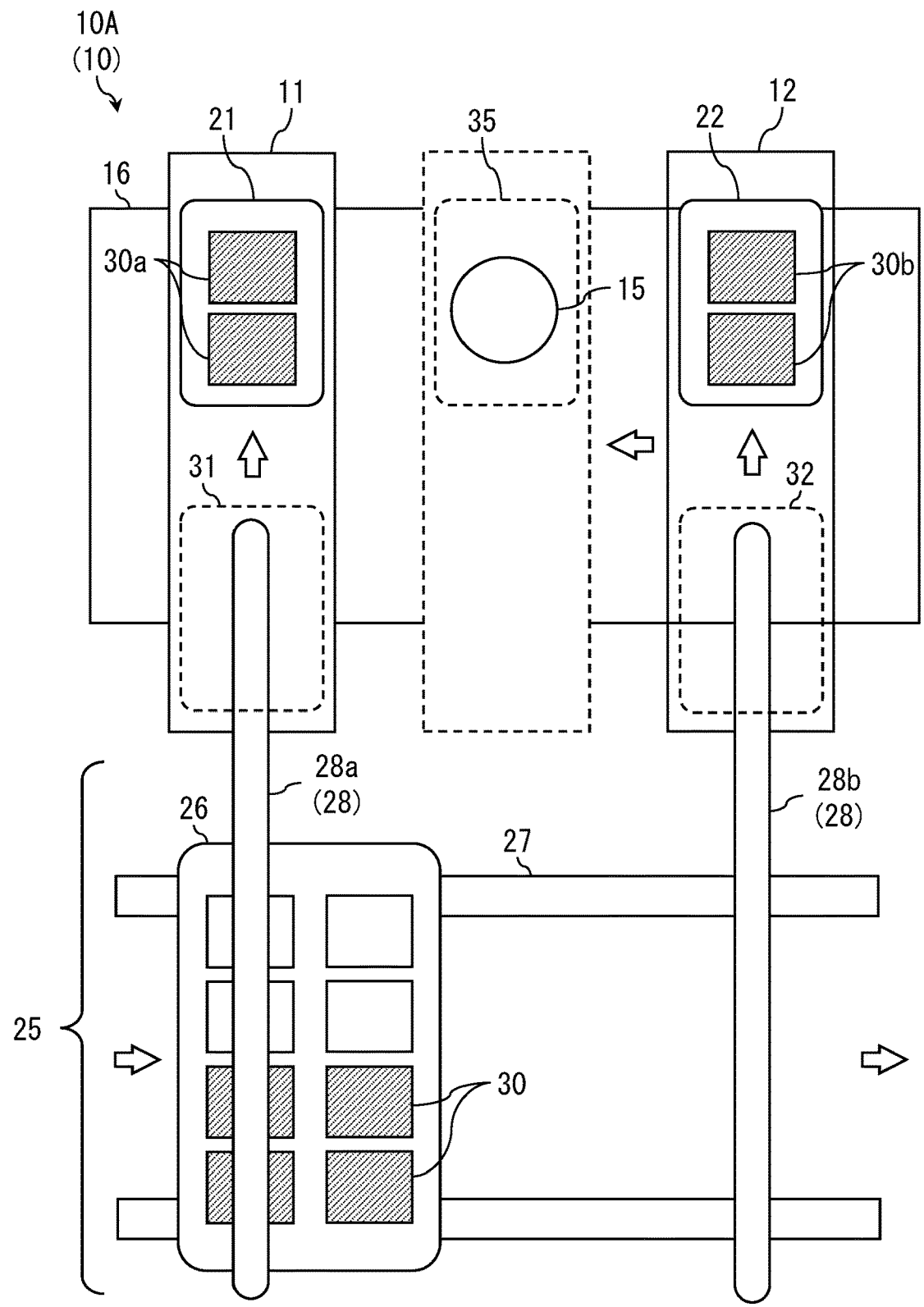
FIG. 1 is a top view of a workpiece inspection apparatus according to the first embodiment of the present invention.

Hereinbelow, embodiments of the present invention will be described by referring to the accompanying drawings. FIG. 1 is a top view of a workpiece inspection apparatus 10A (10) according to the first embodiment of the present invention.

The workpiece inspection apparatus 10 includes: a first stage 11 configured to transfer a first table 21, on which a workpiece 30a is loaded at a first transfer position 31, to an inspection position 35; an inspection tool 15 configured to inspect workpieces 30 at the inspection position 35; a second stage 12 configured to transfer a second table 22, on which another workpiece 30b is loaded at a second transfer position 32, to the inspection position 35 after retraction of the first table 21; and a transporter 25 configured to load the workpieces 30 before inspection to the first transfer position 31 and the second transfer position 32 and unload the workpieces 30a and 30b after the inspection from the first transfer position 31 and the second transfer position 32.

In the present embodiment, a description will be given of a process of: sequentially loading the uninspected workpieces 30 accommodated in a tray 26 to the first transfer position 31 and the second transfer position 32; and unloading the inspected workpieces 30 from the first transfer position 31 and the second transfer position 32 to the same position in the same tray. However, the process of loading and unloading the workpieces 30 is not limited to the above-described aspect. For example, the source tray and the destination tray are different in some cases. Additionally, the destination tray differs depending on the inspection result (OK, NG) in some cases.

The workpiece inspection apparatus 10 further includes a stage mover 16. This stage mover 16 moves the first stage 11 and the second stage 12, which are to be arranged in parallel with each other, in a cross direction that intersects the longitudinal directions of the respective stages 11 and 12. The first stage 11 cooperates with the stage mover 16 so as to repeatedly reciprocate the first table 21 between the first transfer position 31 and the inspection position 35. Similarly, the second stage 12 cooperates with the stage mover 16 so as to repeatedly reciprocate the second table 22 between the second transfer position 32 and the inspection position 35.

Further, the first stage 11 and the second stage 12 are configured to be independently movable with respect to the stage mover 16. As a result, inspection can be performed at any position by moving the workpiece 30 under the state where the inspection tool 15 is fixed.

As a modification of the workpiece inspection apparatus 10, it can also take a form in which such a stage mover 16 is not required. For example, longitudinally aligned first stage 11 and second stage 12 are arranged along the radial direction centered at the inspection position 35. This allows the workpieces 30 to be loaded from each of the first transfer position and the second transfer position at the radial ends of the first stage 11 and the second stage 12 and to be transferred to the inspection position 35 at its radial center.

The stage mover 16 is preferably achieved by a moving-coil type linear motor stage, which includes guides and fixed permanent magnets at its bases and has a structure of arranging mover coils at the bases of the movable first stage 11 and second stage 12. This allows the stage mover 16 to operate the first stage 11 and the second stage 12 independently with a compact configuration. The moving-coil type linear motor stage can also be used for each of the first stage 11 and the second stage 12. Note that a general ball screw method can be adopted for the stage mover 16, the first stage 11, and the second stage 12.

The transporter 25 obtains the (fully loaded) tray 26, in which the workpieces 30 before inspection are accommodated, from the left side in the figure. Further, transfer of the workpieces 30 is performed by alternately positioning the tray 26 near the first transfer position 31 and the second transfer position 32. Moreover, the (fully loaded) tray 26 accommodating the workpieces 30 after the inspection is discharged to the right side in the figure.

The transporter 25 operating in the above-described manner includes: a conveyor 27 configured to place and move the tray 26; and transport robots (28a and 28b) configured to transfer the workpieces 30 between the tray 26 and the transfer positions 31 and 32 by picking up and releasing workpieces 30. The operation of the transporter 25 is achieved in combination with a plurality of linear movements as shown in the figure, and is also achieved in combination with a multi-axis robot arm configured to further perform rotational movements in some cases.

The conveyor 27 is configured by arranging carriers composed of belts, plastic chains, or the like in two rows. The tray 26, in which the workpieces 30 are two-dimensionally arranged, moves in the horizontal direction in the figure while being supported by the conveyor 27 at both ends, and is positioned near the first transfer position 31 or the second transfer position 32.

The operation of the workpiece inspection apparatus 10A according to the first embodiment will be described on the basis of FIGS. 2A to 2D, FIGS. 3E to 3H, and FIGS. 4I to 4L.

In the initial state of FIG. 2A, the first table 21 of the first stage 11 is at the first transfer position 31, and the second table 22 of the second stage 12 is at the second transfer position 32. The transporter 25 obtains the tray 26 accommodating the workpieces 30 before inspection from the left side in the figure, and positions them near the first transfer position 31. In this state, the workpiece 30a accommodated in the tray 26 is loaded on the first table 21 located at the first transfer position 31.

Next, as shown in FIG. 2B, the first stage 11 transfers the first table 21 with the workpiece 30a loaded thereon to the inspection position 35, and the inspection tool 15 starts the inspection of the workpiece 30a. Additionally, the transporter 25 positions the tray 26, in which the workpieces 30 before inspection are accommodated, near the second transfer position 32. In this state, the workpiece 30b accommodated in the tray 26 is loaded on the second table 22 located at the second transfer position 32.

Next, as shown in FIG. 2C, the transporter 25 positions the tray 26, in which the workpieces 30 before inspection are accommodated, near the first transfer position 31. Additionally, the second stage 12 moves the second table 22 to the opposite side while staying at the same position, and then enters a standby state until the inspection of the workpiece 30a of the first table 21 is completed.

Further, as shown in FIG. 2D, when or after the inspection of the workpiece 30a is completed, the first stage 11 is retracted from the inspection position 35. At the same as this retraction (i.e., in exchange), the second stage 12 transfers the second table 22 having been waiting hitherto to the inspection position 35, and the inspection tool 15 starts the inspection of the workpiece 30b.

Figure 3E:
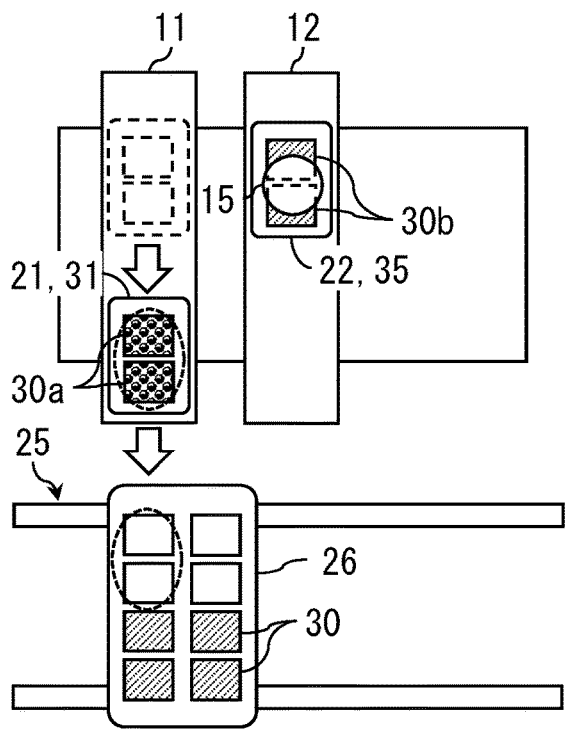
FIGS. 3E, 3F, 3G, and 3H are schematic diagrams illustrating the operation of the workpiece inspection apparatus according to the first embodiment.

Next, as shown in FIG. 3E, during the inspection of the workpiece 30b placed on the second stage 12, the first stage 11 transfers the first table 21, on which the workpiece 30a after the inspection is placed, to the first transfer position 31 while staying at the same position. Additionally, the transporter 25 unloads the inspected workpiece 30a from the first transfer position 31 to the tray 26.

Figure 3F:
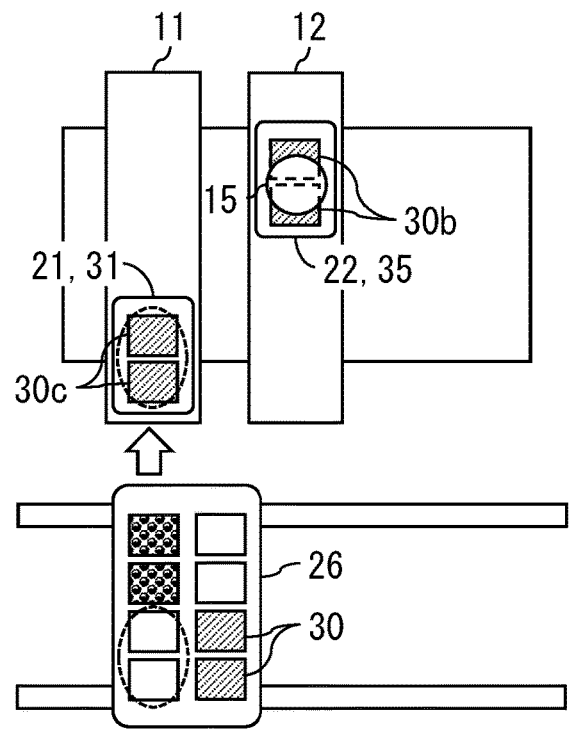

Next, as shown in FIG. 3F, during the inspection of the workpiece 30b placed on the second stage 12, a workpiece 30c accommodated in the tray 26 is loaded on the first table 21 located at the first transfer position 31.

Figure 3G:
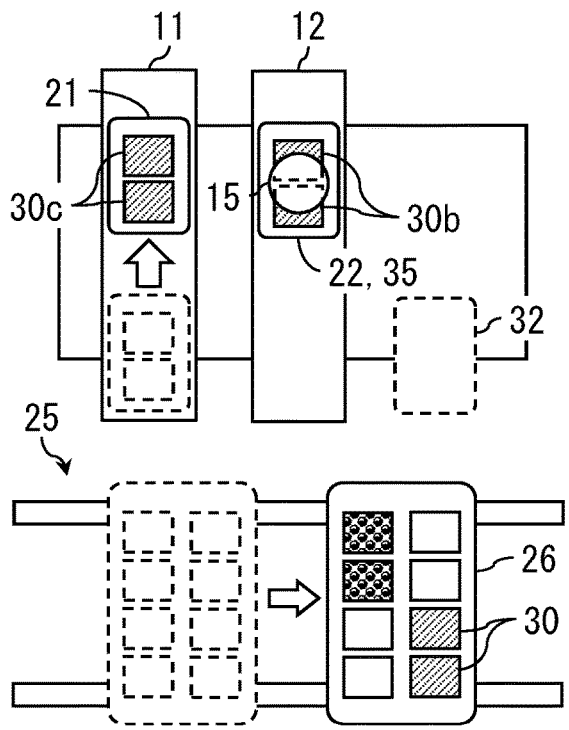

Next, as shown in FIG. 3G, the transporter 25 positions the tray 26, in which the workpieces 30 before inspection are accommodated, near the second transfer position 32. Additionally, the first stage 11 moves the first table 21 to the opposite side while staying at the same position, and then enters the standby state until the inspection of the workpiece 30b of the second table 22 is completed.

Figure 3H:
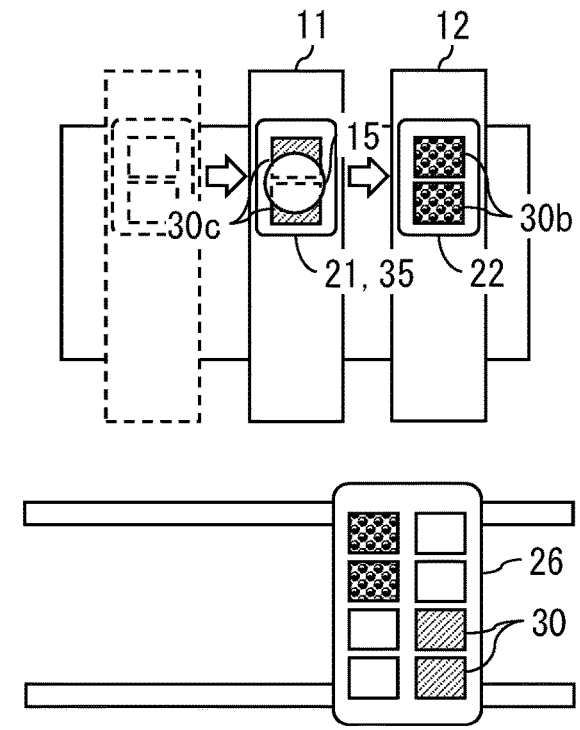

Next, as shown in FIG. 3H, when or after the inspection of the workpiece 30b is completed, the second stage 12 is retracted from the inspection position 35. At the same time as this retraction (i.e., in exchange), the first stage 11 transfers the first table 21 having been waiting hitherto to the inspection position 35, and the inspection tool 15 starts the inspection of the workpiece 30c.

Figures 4I, 4J:
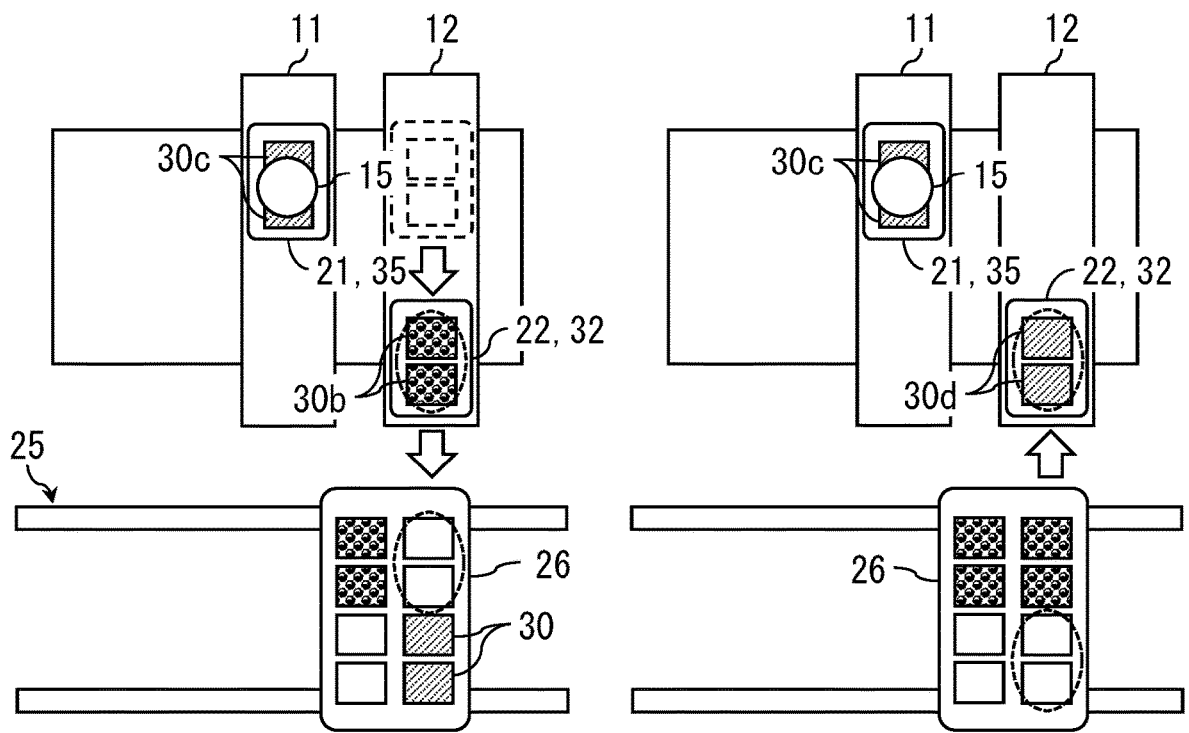
FIGS. 4I, 4J, 4K, and 4L are schematic diagrams illustrating the operation of the workpiece inspection apparatus according to the first embodiment.

Next, as shown in FIG. 4I, during the inspection of the workpiece 30c placed on the first stage 11, the second stage 12 transfers the second table 22, on which the workpiece 30b after the inspection is placed, to the second transfer position 32 while staying at the same position. Additionally, the transporter 25 unloads the inspected workpiece 30b from the second transfer position 32 to the tray 26.

Next, as shown in FIG. 4J, during the inspection of the workpiece 30c placed on the first stage 11, a workpiece 30d accommodated in the tray 26 is transferred to the second table 22 located at the second transfer position 32.

Figures 4K, 4L:
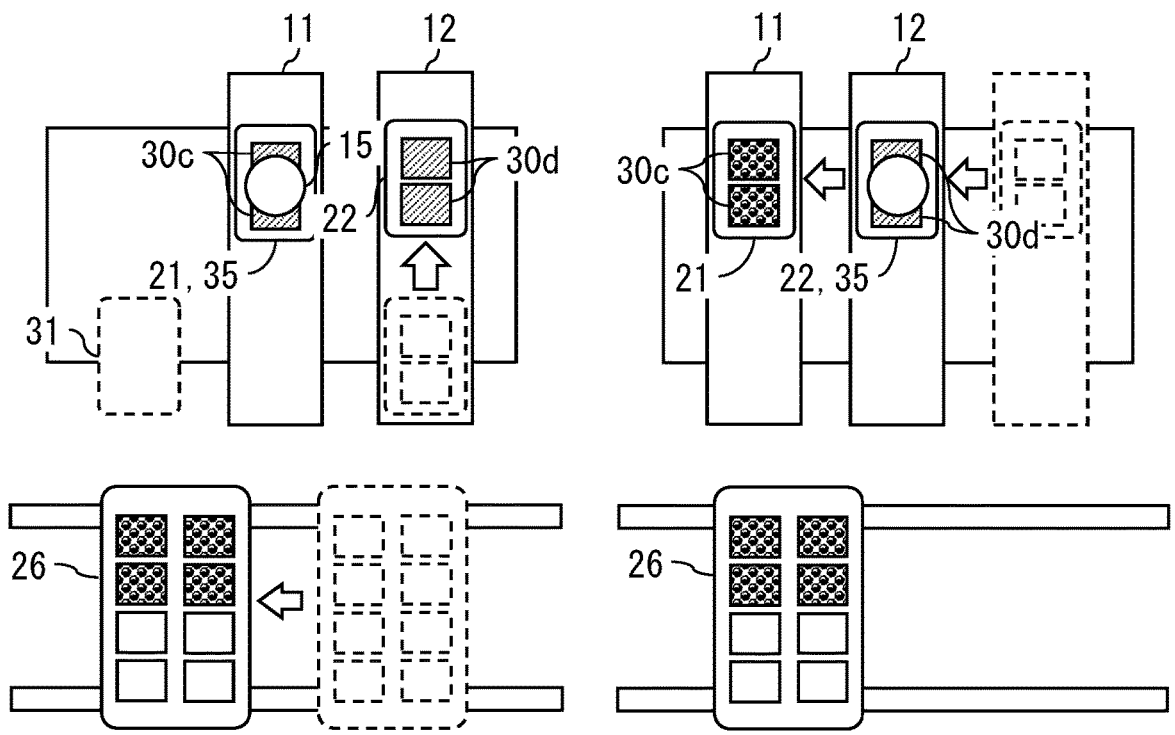

Next, as shown in FIG. 4K, the transporter 25 positions the tray 26, in which the workpieces 30 before inspection are accommodated, near the first transfer position 31. Additionally, the second stage 12 moves the second table 22 to the opposite side while staying at the same position, and then enters the standby state until the inspection of the workpiece 30c of the first table 21 is completed.

Next, as shown in FIG. 4L, when or after the inspection of the workpiece 30c is completed, the first stage 11 is retracted from the inspection position 35. At the same time as this retraction (i.e., in exchange), the second stage 12 transfers the second table 22 having been waiting hitherto to the inspection position 35, and the inspection tool 15 starts the inspection of the workpiece 30d. Afterward, the flow from FIG. 3E is repeated, and when the tray 26 runs out of uninspected workpieces 30, the transporter 25 discharges this tray 26 and obtains a new tray.

In this manner, when or after the inspection of one workpiece 30 is completed, at the same time as the retraction (i.e., in exchange), the inspection of the next workpiece 30 waiting in the vicinity can be started. As a result, the first stage 11 and the second stage 12 can supply the workpieces 30 to the inspection position 35 unintermittedly, and thus, the throughput of the workpiece inspection is not decreased. Additionally, during inspection of the workpiece(s) 30 at the inspection position 35, the first table 21 and the second table 22 can be moved with respect to the inspection tool 15 in small increments. As a result, even when the inspection range of the inspection tool 15 is narrow, the workpieces 30 can be inspected over a wide range.

Figure 5A:
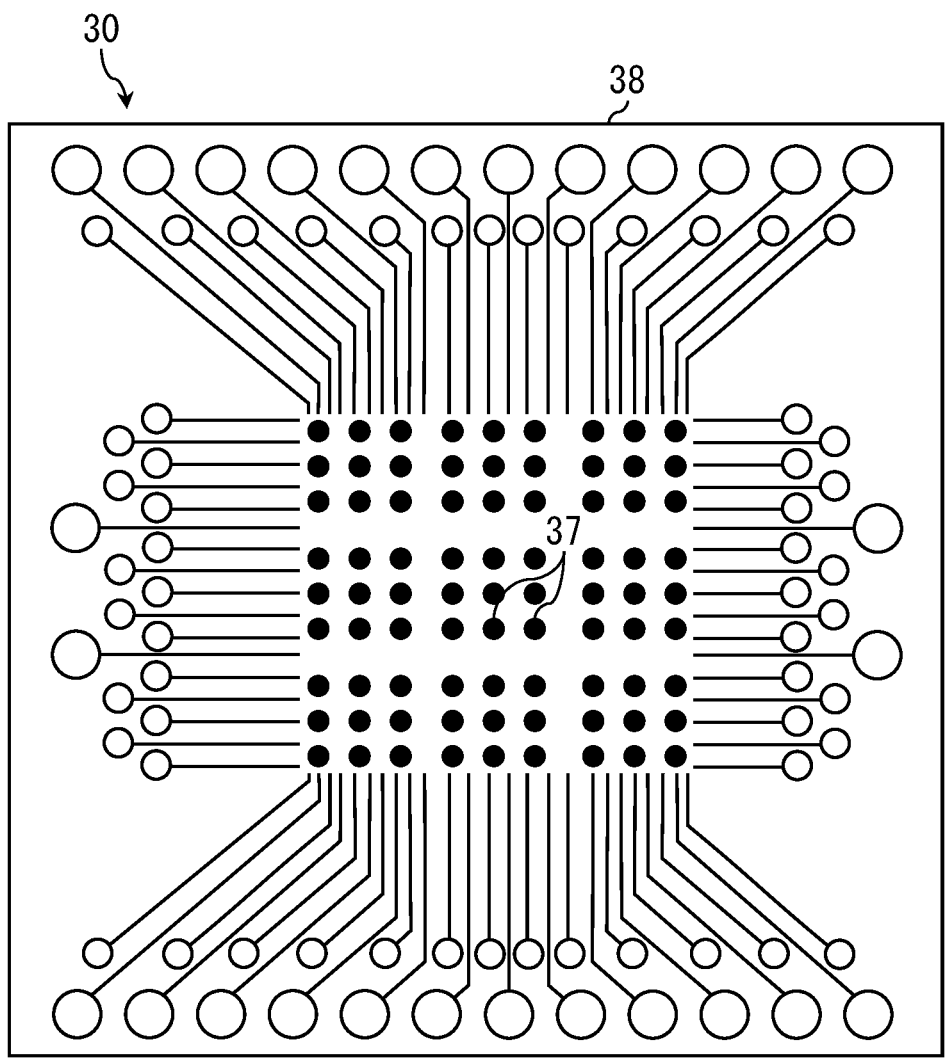
FIG. 5A is a top transparent view of a multi-layer wiring substrate, which is to be applied as a workpiece of the present embodiment and have bumps arrayed on its top surface.
Figure 5B:
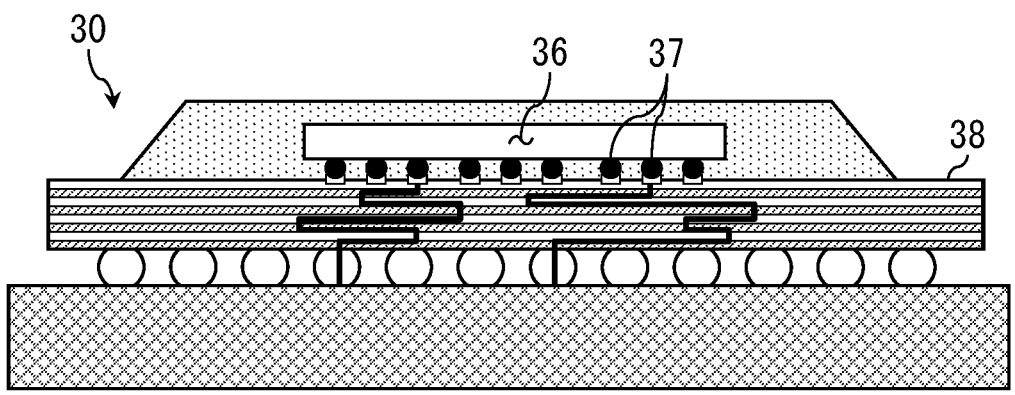
FIG. 5B is a side transparent view of an LSI package in which an LSI chip is mounted on the multi-layer wiring substrate.

FIG. 5A is a top transparent view of a multi-layer wiring substrate 38, which is to be applied as a workpiece of the present embodiment and have bumps 37 arrayed on its top surface. FIG. 5B is a side transparent view of an LSI package in which an LSI chip 36 is mounted on this multi-layer wiring substrate 38. In this LSI package, electrodes of the multi-layer wiring substrate 38 and electrodes of the LSI chip 36 are electrically connected by the bumps 37. Further, the LSI package is packaged with resin as a countermeasure against deterioration and heat. This method of electrical connection using the ball-shaped bumps 37 is referred to as flip-chip packaging.

In the flip-chip packaging, the respective bumps 37 are required to be of equal height in order to directly overlap the electrodes of the multi-layer wiring substrate 38 and the electrodes of the LSI chip 36 with each other. This is because a connection failure occurs if there is variation in height of the bumps 37. Aside from that, it is required to detect defects such as bump positions, bump diameter, other bump shape abnormality, and foreign matters on the substrate. Although the workpiece 30 is illustrated as an LSI package in the embodiment, the workpiece 30 is not limited to this. It is applicable as long as the workpiece can be placed on the tray 26, the first table 21, and the second table 22.

The inspection tool 15 is a measurement/inspection instrument that measures various dimensions of the bumps 37 arrayed on the top surface of the multi-layer wiring substrate 38 and detects foreign matters and the like. Specifically, the inspection tool 15 is a measurement/inspection instrument that has an image measuring instrument and a surface-profile measuring instrument using light or functions of both and can measure surface unevenness information. The inspection tool 15 is not particularly limited. Any tool configured to inspect the workpiece 30 can be appropriately adopted as the inspection tool 15 regardless of whether it is a contact type or a non-contact type.

Second Embodiment

Figure 6:
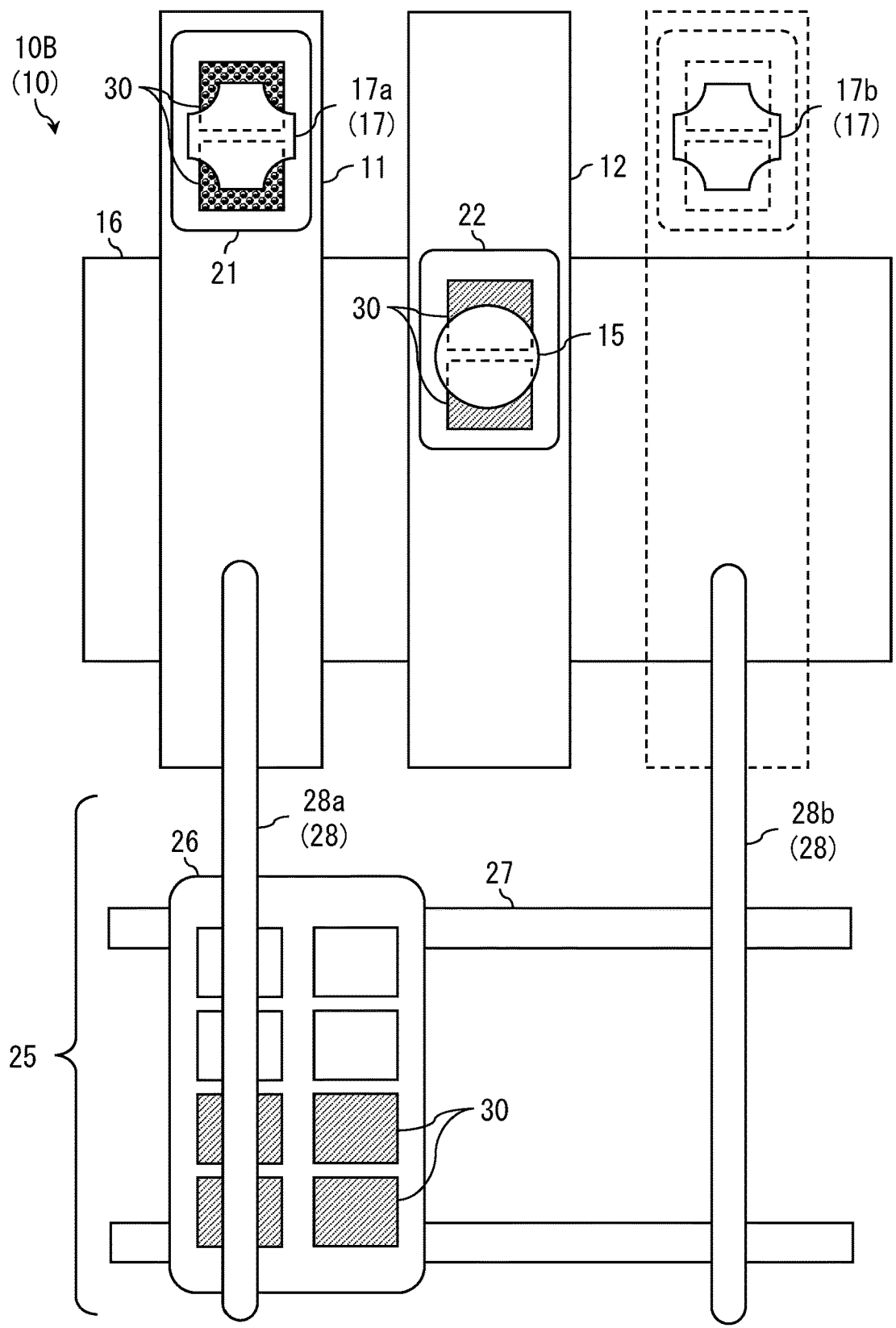
FIG. 6 is a top view of the workpiece inspection apparatus according to the second embodiment of the present invention.

Next, the second embodiment of the present invention will be described by referring to FIG. 6. FIG. 6 is a top view of the workpiece inspection apparatus 10B (10) according to the second embodiment of the present invention. The workpiece inspection apparatus 10B according to the second embodiment has a configuration in which separate-case inspection tools 17 (17a, 17b) are added to the configuration of the above-described first embodiment. In FIG. 6, each component having the same configuration or function as any component in FIG. 1 is denoted by the same reference sign, and duplicate description is omitted.

The separate-case inspection tool 17a (17) is positioned so as to separately inspect the workpiece 30 on the first stage 11 on the side opposite to the first transfer position 31. The separate-case inspection tool 17b (17) is positioned so as to separately inspect the workpiece 30 on the second stage 12 on the side opposite to the second transfer position 32.

Each of the first stage 11 and the second stage 12 of the second embodiment can extend its tip more than the first embodiment in such a manner that the inspection tool 15 and the separate-case inspection tools 17 do not interfere with each other. As long as the inspection by the separate-case inspection tool(s) 17 can also be performed during the inspection by the inspection tool 15, it does not decrease the throughput of the workpiece inspection.

Specific aspects of the separate-case inspection tools 17 include a reader for identification ID marked on the workpiece 30. This makes it easier to associate the identification data of the workpieces 30 obtained by the separate-case inspection tools 17 with the inspection data obtained by the inspection tool 15 and manage them. The separate-case inspection tools 17 are not limited to such an identification ID reader, and arbitrary devices can be adopted.

Third Embodiment

Figure 7:
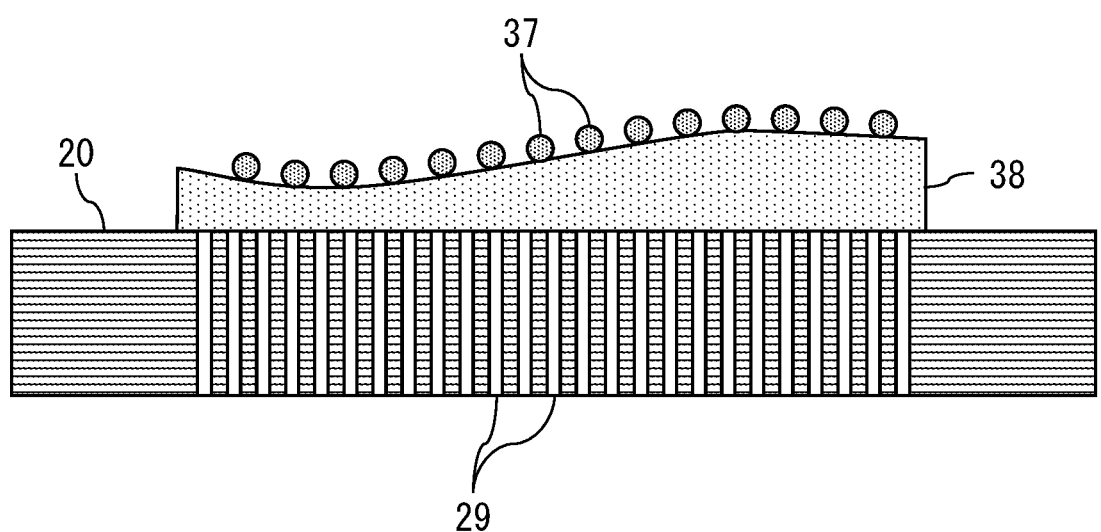
FIG. 7 is a longitudinal cross-sectional view of a vacuum jig, which is to be applied to the workpiece inspection apparatus according to the third embodiment of the present invention and sucks the bottom surface of the multi-layer wiring substrate.

FIG. 7 is a longitudinal cross-sectional view of a vacuum jig (suction jig), which is to be applied to the workpiece inspection apparatus 10 according to the third embodiment of the present invention and sucks the bottom surface of the multi-layer wiring substrate. In order to obtain satisfactory electrical connection, in addition to uniformity of the respective shapes of the bumps 37, it is required that the multi-layer wiring substrate 38 has no warpage and no thickness variation or it is required to consider warpage and thickness variation.

Thus, the third embodiment is characterized in that the vacuum jigs 20 configured to suck the bottom surface of the multi-layer wiring substrate 38 are installed on the respective first table 21 and second table 22. The workpiece inspection apparatus of the third embodiment is achieved by adding the vacuum jigs 20 to the workpiece inspection apparatus 10 (10A, 10B) of the first or second embodiment. Each vacuum jig 20 is provided with a plurality of suction holes 29, each of which passes through it in the thickness direction and communicates with a decompression apparatus (not shown).

REFERENCE SIGNS LIST

10 (10A, 10B) workpiece inspection apparatus
11 first stage
12 second stage
15 inspection tool
16 stage mover
17 (17a, 17b) other-case inspection tool
20 vacuum jig
21 first table
22 second table
25 transporter
26 tray
27 conveyor
29 suction hole
(30a, 30b) workpiece
31 first transfer position
32 second transfer position
35 inspection position
36 LSI chip
37 bump
38 multi-layer wiring substrate

The invention claimed is:

1. A workpiece inspection apparatus comprising:
a first stage configured to transfer a first table to an inspection position, the first table being a table on which a workpiece is loaded at a first transfer position;
an inspection tool configured to inspect the workpiece at the inspection position, where the inspection tool is in a state of unmoving;
a second stage configured to transfer a second table to the inspection position after retraction of the first table, the second table being a table on which another workpiece is loaded at a second transfer position;
a stage mover configured to independently reciprocate the first stage and the second stage in a cross direction that intersects respective transfer directions of the first stage and the second stage, the first stage and the second stage being arranged parallel to each other; and
a transporter configured to load the workpiece before inspection to each of the first transfer position and the second transfer position and unload the workpiece after inspection from each of the first transfer position and the second transfer position,
wherein:
after completion of inspection of the workpiece placed on the first table by the inspection tool, the stage mover replaces the first stage with the second stage at the inspection position by retracting the first stage in the cross direction;
during inspection of the workpiece placed on the second table by the inspection tool, the transporter unloads the workpiece after inspection and loads the workpiece before inspection at the first transfer position;
after completion of inspection of the workpiece placed on the second table by the inspection tool, the stage mover replaces the second stage with the first stage at the inspection position by retracting the second stage in the cross direction;
during inspection of the workpiece placed on the first table by the inspection tool, the transporter unloads the workpiece after inspection and loads the workpiece before inspection at the second transfer position; and
the workpiece is inspected with movement of the first table and the second table in small increments with respect to the inspection tool at the inspection position.

2. The workpiece inspection apparatus according to claim 1, wherein the workpiece is a multi-layer wiring substrate with bumps that are arrayed on a top surface of the multi-layer wiring substrate and electrically connect an LSI chip.

3. The workpiece inspection apparatus according to claim 2, further comprising vacuum jigs that are installed on the respective first table and second table and create suction at a bottom surface of the multi-layer wiring substrate.

4. The workpiece inspection apparatus according to claim 1, further comprising a separate inspection tool configured to separately inspect:
another workpiece positioned on the first stage on a side opposite to the first transfer position; and
another workpiece positioned on the second stage on a side opposite to the second transfer position.

5. The workpiece inspection apparatus according to claim 1, wherein the transporter is configured to:
obtain a tray in which the workpiece before inspection is accommodated;
perform transfer of the workpiece by alternately positioning the tray near the first transfer position and the second transfer position; and
discharge the tray in which the workpiece after inspection is accommodated.

\* \* \* \* \*